United States Patent
Rajski et al.

(10) Patent No.: US 9,088,522 B2
(45) Date of Patent: Jul. 21, 2015

(54) TEST SCHEDULING WITH PATTERN-INDEPENDENT TEST ACCESS MECHANISM

(75) Inventors: Janusz Rajski, West Linn, OR (US); Mark A Kassab, Wilsonville, OR (US); Grzegorz Mrugalski, Swarzedz (PL); Nilanjan Mukherjee, Wilsonville, OR (US); Jakub Janicki, Poznan (PL); Jerzy Tyszer, Poznan (PL); Avijit Dutta, Tigard, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 6 days.

(21) Appl. No.: 13/980,287

(22) PCT Filed: Jan. 17, 2012

(86) PCT No.: PCT/US2012/021575
§ 371 (c)(1), (2), (4) Date: Jul. 17, 2013

(87) PCT Pub. No.: WO2012/150970
PCT Pub. Date: Nov. 8, 2012

(65) Prior Publication Data
US 2013/0290795 A1    Oct. 31, 2013

Related U.S. Application Data

(60) Provisional application No. 61/433,509, filed on Jan. 17, 2011.

(51) Int. Cl.
*H04L 12/26* (2006.01)
*G01R 31/3183* (2006.01)
*G06F 11/263* (2006.01)

(52) U.S. Cl.
CPC ........ *H04L 43/50* (2013.01); *G01R 31/318335* (2013.01); *G06F 11/263* (2013.01)

(58) Field of Classification Search
CPC ............ G01R 31/318335; H04L 43/50; G06F 11/263
USPC .................................. 714/726, 727–731, 733
See application file for complete search history.

(56) References Cited

U.S. PATENT DOCUMENTS 7,730,373 B2 *   6/2010   Wang et al. .................... 714/729
2007/0288796 A1   12/2007   Whetsel (Continued)

OTHER PUBLICATIONS

Larsson, E.; Arvidsson, K.; Fujiwara, H.; Zebo Peng, "Integrated test scheduling, test parallelization and TAM design," Test Symposium, 2002. (ATS '02). Proceedings of the 11th Asian , vol., No., pp. 397,404, Nov. 18-20, 2002.*

(Continued)

*Primary Examiner* — Cynthia Britt

(57) ABSTRACT

Disclosed are representative embodiments of methods, apparatus, and systems for test scheduling for testing a plurality of cores in a system on circuit. Test data are encoded to derive compressed test patterns that require small numbers of core input channels. Core input/output channel requirement information for each of the compressed test patterns is determined accordingly. The compressed patterns are grouped into test pattern classes. The formation of the test pattern classes is followed by allocation circuit input and output channels and test application time slots that may comprise merging complementary test pattern classes into clusters that can work with a particular test access mechanism. The test access mechanism may be designed independent of the test data.

18 Claims, 9 Drawing Sheets

(56) References Cited

U.S. PATENT DOCUMENTS

2008/0065940 A1  3/2008  Wang et al.
2010/0313089 A1* 12/2010 Rajski et al. .............. 714/731

OTHER PUBLICATIONS

Schiano, L.; Yong Bin Kim; Lombardi, F., "Scan test of IP cores in an ATE environment," Field-Programmable Technology, 2004. Proceedings. 2004 IEEE International Conference on , vol., No., pp. 281,286, Jan. 28-30, 2004.*
Chunsheng Liu; Link, Z.; Pradhan, D.K., "Reuse-based test access and integrated test scheduling for network-on-chip," Design, Automation and Test in Europe, 2006. Date '06. Proceedings , vol. 1, No., pp. 6 pp.,, Mar. 6-10, 2006.*
Remmers, J.; Lee, D.; Fisette, R., "Hierarchical DFT with enhancements for AC scan, test scheduling and on-chip compression—a case study," Test Conference, 2005. Proceedings. ITC 2005. IEEE International , vol., No., pp. 9 pp. 725, 8-8 Nov. 2005.*
W. Zou, S.M. Reddy, I. Pomeranz, and Y. Huang, "SoC test scheduling using simulated annealing," Proc. VTS, pp. 325-330, 2003.
A. M. Amory, K. Goossens, E. J. Marinissen, M. Luba-szewski, and F. Moraes, "Wrapper design for the reuse of networks-on-chip as test access mechanism," Proc. ETS, pp. 213-218, 2006.
K. Chakrabarty, "Test scheduling for core-based systems using mixed-integer linear programming," IEEE Trans. CAD, vol. 19, pp. 1163-1174, Oct. 2000.
K. Chakrabarty, "A synthesis-for-transparency approach for hierarchical and system-on-a-chip test," IEEE Trans. VLSI, vol. 11, pp. 167-179, Apr. 2003.
K. Chakrabarty, V. Iyengar, and M. D. Krasniewski, "Test planning for modular testing of hierarchical SOCs," IEEE Trans. CAD, vol. 24, pp. 435-448, Mar. 2005.
A. Chandra and K. Chakrabarty, "A unified approach to reduce SoC test data volume, scan power and testing time," IEEE Trans. CAD, vol. 22, pp. 352-362, Mar. 2003.
R. M. Chou, K. K. Saluja, and V. D. Agrawal, "Scheduling tests for VLSI systems under power constraints," IEEE Trans. VLSI, vol. 5, pp. 175-184, Jun. 1997.
R. Garg, R. Putman, and N.A. Touba, "Increasing output compaction in presence of unknowns using an X-canceling MISR with deterministic observation," Proc. VTS, pp. 35-42, 2008.
I. Ghosh, S. Dey, and N. Jha, "A fast and low cost testing technique for core-based system-on-chip," Proc. DAC, pp. 542-547, 1998.
G. Giles, J. Wang, A. Sehgal, K. J. Balakrishnan, and J. Wingfield, "Test access mechanism for multiple identical cores," Proc ITC, paper 2.3, 2008.
[S. K. Goel and E. J. Marinissen, "Effective and efficient test architecture design for SOCs," Proc. ITC, pp. 529-538, 2002.
S. K. Goel, E. J. Marinissen, A. Sehgal, and K. Chakrabarty "Testing of SoCs with hierarchical cores: common fallacies, test access optimization, and test scheduling," IEEE Trans. Comput., vol. 58, pp. 409-423, Mar. 2009.
P. T. Gonciari and B. M. Al-Hashimi, "A compression-driven test access mechanism design approach," Proc. ETS, pp. 100-105, 2004.
Z. He, Z. Peng, P. and Eles, "A heuristic for thermal-safe SoC test scheduling," Proc. ITC, paper 5.2, 2007.
Z. He, Z. Peng, P. Eles, P. Rosinger, and B.M. Al-Hashimi, "Thermal aware SoC test scheduling with test set partition-ing and interleaving," Proc. DFT, pp. 477-485, 2006.
J.E. Hopcroft and R.M. Karp, "An n5/2 algorithm for maxi-mum matchings in bipartite graphs," SIAM Journal on Computing, vol. 2, No. 4, pp. 225-231, 1973.
Y. Huang, S. M. Reddy, W.-T. Cheng, P. Reuter, N. Mukherjee, C. C. Tsai, O. Samman, and Y. Zaidan, "Opti-mal core wrapper width selection and SOC test scheduling based on 3-D bin packing algorithm," Proc. ITC, pp. 74-82, 2002.
U. Ingelsson, S. K. Goel, E. Larsson, and E. J. Marinissen, "Test scheduling for modular SOCs in an abort-on-fail environment," Proc. ETS, pp. 8-13, 2004. 22.

V. Iyengar and K. Chakrabarty, "System-on-a-chip test scheduling with precedence relationships, preemption, and power constraints," IEEE Trans. CAD, vol. 21, pp. 1088-1094, Sep. 2002.
V. Iyengar, K. Chakrabarty, and E. J. Marinissen, "Test wrapper and test access mechanism co-optimization for system-on-chip," JETTA, vol. 18, pp. 213-230, Apr. 2002.
V. Iyengar, K. Chakrabarty, and E. J. Marinissen, "Efficient test access mechanism optimization for system-no-chip," IEEE Trans. CAD, vol. 22, pp. 635-643, May 2003.
V. Iyengar, K. Chakrabarty, and E. J. Marinissen, "Test access mechanism optimization, test scheduling, and tester data volume reduction for system-on-chip," IEEE Trans. Comput., vol. 52, pp. 1619-1632, Dec. 2003.
V. Iyengar, A. Chandra, S. Schweizer, and K. Chakrabarty, "A unified approach for SOC testing using test data com-pression and TAM optimization," Proc. Date, pp. 1188-1189, 2003.
J. Janicki, M. Kassab, G. Mrugalski, N. Mukherjee, J. Rajski, and J. Tyszer, "Dynamic channel allocation for higher EDT compression in SoC designs," Proc. ITC, paper 9.2, 2010.
A. B. Kinsman and N. Nicolici, "Time-multiplexed test data decompression architecture for core-based SOCs with improved utilization of tester channels," Proc. ETS, pp. 196-201, 2005.
S. Koranne, "Formulating SoC test scheduling as a network transportation problem," IEEE Trans. CAD, vol. 21, pp. 1517-1525, Dec. 2002.
E. Larsson and H. Fujiwara, "Power constrained preemptive TAM scheduling," Proc. ETW, pp. 119-126, 2002.
E. Larsson and H. Fujiwara "System-on-chip test scheduling with reconfigurable core wrappers," IEEE Trans. VLSI, vol. 14, No. 3, pp. 305-309, Mar. 2006.
E. Larsson and Z. Peng, "An integrated framework for the design and optimization of SOC test solutions," JETTA, vol. 18, pp. 385-400, Aug.-Oct. 2002.
E. Larsson, J. Pouget, and Z. Peng, Defect-aware SoC test scheduling, Proc. VTS, pp. 359-364, 2004.
C. Liu, E. Cota, H. Sharif, and D. K. Pradhan, "Test scheduling for network-on-chip with BIST and precedence constraints," Proc. ITC, pp. 1369-1378, 2004.
C. Liu, V. Iyengar, and D. K. Pradhan, "Thermal-aware testing of network-on-chip using multiple clocking," Proc. VTS, pp. 46-51, 2006.
E. J. Marinissen, S. K. Goel, and M. Lousberg, "Wrapper design for embedded core test," Proc. ITC, pp. 911-920, 2000.
J. Rajski, J. Tyszer, M. Kassab, and N. Mukherjee, "Embedded deterministic test," IEEE Trans. CAD, vol. 23, pp. 776-792, May 2004.
J. Rajski, J. Tyszer, G. Mrugalski, N. Mukherjee, W.-T. Cheng, M. Kassab, "X-Press: two-stage X-tolerant com-pactor with programmable selector", IEEE Trans. CAD, vol. 27, pp. 147-159, Jan. 2008.
A. Sabne, R. Tiwari, A. Shrivastava, S. Ravi, and R. Pa-rekhji, "A generic low power scan chain wrapper for designs using scan compression," Proc. VTS, pp. 135-140, 2010.
S. Samii, M. Selkala, E. Larsson, K. Chakrabarty, and Z. Peng, "Cycle-accurate test power modeling and its application to SoC test architecture design and scheduling," IEEE Trans. CAD, vol. 27, pp. 973-977, May 2008.
A. Sehgal, S. K. Goel, E. J. Marinissen, and K. Chakrabarty, "IEEE P1500-compliant test wrapper design for hierarchical cores," Proc. ITC, pp. 1203-1212, 2004.
A. Sehgal, S. K. Goel, E. J. Marinissen, and K. Chakrabarty, "Hierarchy-aware and area-efficient test infrastructure design for core-based system chips," Proc. Date, pp. 285-290, 2006.
A. Sehgal, V. Iyengar, and K. Chakrabarty, "SOC test planing using virtual test access architectures," IEEE Trans. VLSI, vol. 12, pp. 1263-1276, Dec. 2004.
M. Sharma and W.-T. Cheng, "X-filter: filtering unknowns from compacted test responses," Proc. ITC, pp. 1090-1098, 2005.
K. Stewart and S. Tragoudas, "Interconnect testing for network on chips," Proc. VTS, pp. 100-105, 2006.
M. Tehranipoor, M. Nourani, and K. Chakrabarty, "Nine-coded compression technique for testing embedded cores in SoCs," IEEE Trans. VLSI, vol. 13, pp. 719-731, Jun. 2005.
N. Touba and B. Pouya, "Testing embedded cores using partial isolation rings," Proc. VTS, pp. 10-16, 1997.

(56) References Cited

OTHER PUBLICATIONS

Z. Wang, K. Chakrabarty, and S. Wang "Integrated LFSR reseeding, test-access optimization, and test scheduling for core-based system-on-chip," IEEE Trans. CAD, vol. 28, pp. 1251-1263, Aug. 2009.

Y. Xia, M. Chrzanowska-Jeske, B. Wang, and M. Jeske, "Using a distributed rectangle bin-packing approach for core-based SoC test scheduling with power constraints," Proc. ICCAD, pp. 100-105, 2003.

Q. Xu and N. Nicolici, "Time/area tradeoffs in testing hierarchical SOCs with hard mega-cores," Proc. ITC, pp. 1196-1202, 2004.

Q. Xu and N. Nicolici, "Multi-frequency test access mechanism design for modular SoC testing," Proc. ATS, pp. 2-7, 2004.

C. Yao, K. K. Saluja, and P. Ramanathan, "Partition based SoC test scheduling with thermal and power constraints under deep submicron technologies," Proc. ATS, pp. 281-286, 2009.

D. Zhao and S. Upadhyaya, "Dynamically partitioned test scheduling with adaptive TAM configuration for power-constrained SoC testing," IEEE Trans. CAD, vol. 24, pp. 956-965, Jun. 2005.

Q. Zhou and K.J. Balakrishnan, "Test cost reduction for SoC using a combined approach to test data compression and test scheduling," Proc. Date, pp. 39-44, 2007.

\* cited by examiner

TEST SCHEDULING WITH PATTERN-INDEPENDENT TEST ACCESS MECHANISM

RELATED APPLICATIONS

This application claims priority to U.S. Provisional Patent Application No. 61/433,509, entitled "EDT Channel Bandwidth Management in SoC Designs," filed on Jan. 17, 2011, and naming Janusz Rajski, et al. as inventors, which application is incorporated entirely herein by reference.

FIELD OF THE INVENTION

The present invention relates to the field of testing integrated circuits. Various aspects of the invention may be particularly useful for test scheduling in a test compression environment.

BACKGROUND OF THE INVENTION

The electronics industry's aggressive shrinking of chip features below 50 nanometers and moving toward three-dimensional integrated circuits have made a dramatic impact on chip design and test. Contemporary system-on-chip (SoC) and system-in-package (SiP) designs embed more than a billion transistors running at operating frequencies in the gigahertz range. These designs can include a variety of digital, analog, mixed-signal, memory, optical, micro-electromechanical and radiofrequency circuits. The popularity of SoC circuits has led to an unprecedented increase in the test cost. This cost increase is primarily attributed to the difficulty in accessing embedded cores during testing, long test development and test application time, and large volumes of test data involved. Although network-on-chip (NoC) systems can alleviate some of the core communication problems, these structures in turn have further complicated the SoC test procedures.

On-chip test compression has established itself as one of the mainstream DFT (Design-for-testability) methodologies. By using on-chip test decompression and compression hardware, a tester can deliver test patterns in a compressed form, and the on-chip decompression hardware can expand (or decompress) the compressed test patterns into the actual test data to be loaded into scan chains. The latter operation is possible because only a small number of bits in the decompressed test patterns typically are specified bits designed to target one or more specific faults in the integrated circuit. The remaining unspecified bits of the decompressed test pattern are termed "don't care" bits and are typically randomly determined as a result of the decompressor structure. A test pattern with defined values for only specified bits is often referred to as a test cube. After the actual test data has been applied, the test response data are captured by the scan chains and are then compressed by the on-chip compression hardware (sometimes referred to as compactor). The compressed test response data are subsequently delivered back to the tester for analysis.

The application of compression techniques in SoC designs requires additional on-chip hardware infrastructure, including a test access mechanism (TAM) and test wrappers. Originally, TAMs were used to transport test stimuli from the SoC pins (circuit input channels) to the embedded cores and test responses from the embedded cores to the SoC pins (circuit output channels), while test wrappers formed the interface between the core and the SoC environment. In addition to dedicated TAMs, cost-effective SoC testing typically requires some form of test scheduling. Test scheduling for SoCs usually involves multiple test resources and cores with multiple tests. Unfortunately, even relatively simple test scheduling algorithms typically are NP (nondeterministic polynomial time)-complete problems. This is because test scheduling has been commonly formulated as a combinatorial open shop scheduling problem with a certain number of processors or as two or three-dimensional bin packing. These methods divide given channels into disjoint subsets. Each subset represents a test bus or a processor in the multiprocessor scheduling problem formulation. Different buses have different widths. Testing of cores can then be performed by accessing each core through only one of the test buses. Dedicated routing paths can be used to deliver tests to cores, while the test-scheduling problem is solved by means of integer linear programming.

Performing both TAM optimization and test scheduling can significantly affect the test time, test data volume, and test cost. U.S. Provisional Patent Application No. 61/314,569, entitled "SOC Testing In Test Compression Environment," filed on Mar. 16, 2010 and International Patent Application No. PCT/US2011/028741, entitled "Test Scheduling And Test Access In Test Compression Environment," filed on Mar. 16, 2011, which applications (referred to as the '569 application and the '028741 application, respectively, hereinafter) are incorporated herein by reference, disclose TAM optimization and test scheduling methods that can dynamically allocate a circuit's test resources. Dynamic channel allocation enables optimal usage of communication channels connecting individual decompressors with external test equipment. These methods, however, are test-pattern-dependent solutions. In particular, an optimal structure for TAM interconnection networks may be obtained only after test patterns are known or derived by running ATPG (automatic test pattern generation) and compression procedures. This dependency may make a design flow complicated.

BRIEF SUMMARY OF THE INVENTION

Disclosed are representative embodiments of methods, apparatus, and systems for test scheduling for testing a plurality of cores in a SoC. With various implementations of the invention, test data are encoded to derive compressed test patterns that require small numbers of core input channels. Each of the compressed test patterns is associated with one or more cores in the plurality of cores and with core input channel requirement information. Some embodiments of the invention generate the compressed test patterns that require minimum numbers of core input channels.

For each of the compressed test patterns, output channel requirement information may then be determined. The determination process may comprise selecting observation points for each of the compressed test patterns. In some embodiments of the invention, a minimal subset of core output channels required for each of the compressed test patterns is determined.

Based on cores associated with each of the compressed test patterns, the core input channel requirement information and the core output channel requirement information, the compressed patterns are grouped into test pattern classes. The grouping process may further be based on other characteristics or properties such as power consumptions.

The formation of the test pattern classes is followed by allocating circuit input and output channels and test application time slots. The allocation process may comprise merging complementary test pattern classes into clusters that can work with a particular TAM.

The TAM may be designed independent of the test data. The TAM may comprise an input switching network and an output switching network. The input switching network may comprise demultiplexers and in some cases, one or more OR gates. The output switching network may comprise an output selector and an egress unit.

DETAILED DESCRIPTION OF THE INVENTION

General Considerations

Various aspects of the present invention relate to test scheduling for testing SoC circuits. In the following description, numerous details are set forth for the purpose of explanation. However, one of ordinary skill in the art will realize that the invention may be practiced without the use of these specific details. In other instances, well-known features have not been described in detail to avoid obscuring the present invention.

Some of the techniques described herein can be implemented by a computer-readable medium having software instructions stored thereon, a programmable computer system executing software instructions, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms such as "encode," "group," "allocate," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one integrated circuit device, such as data to be used to form multiple integrated circuit devices on a single wafer.

Illustrative Operating Environment

Figure 1:
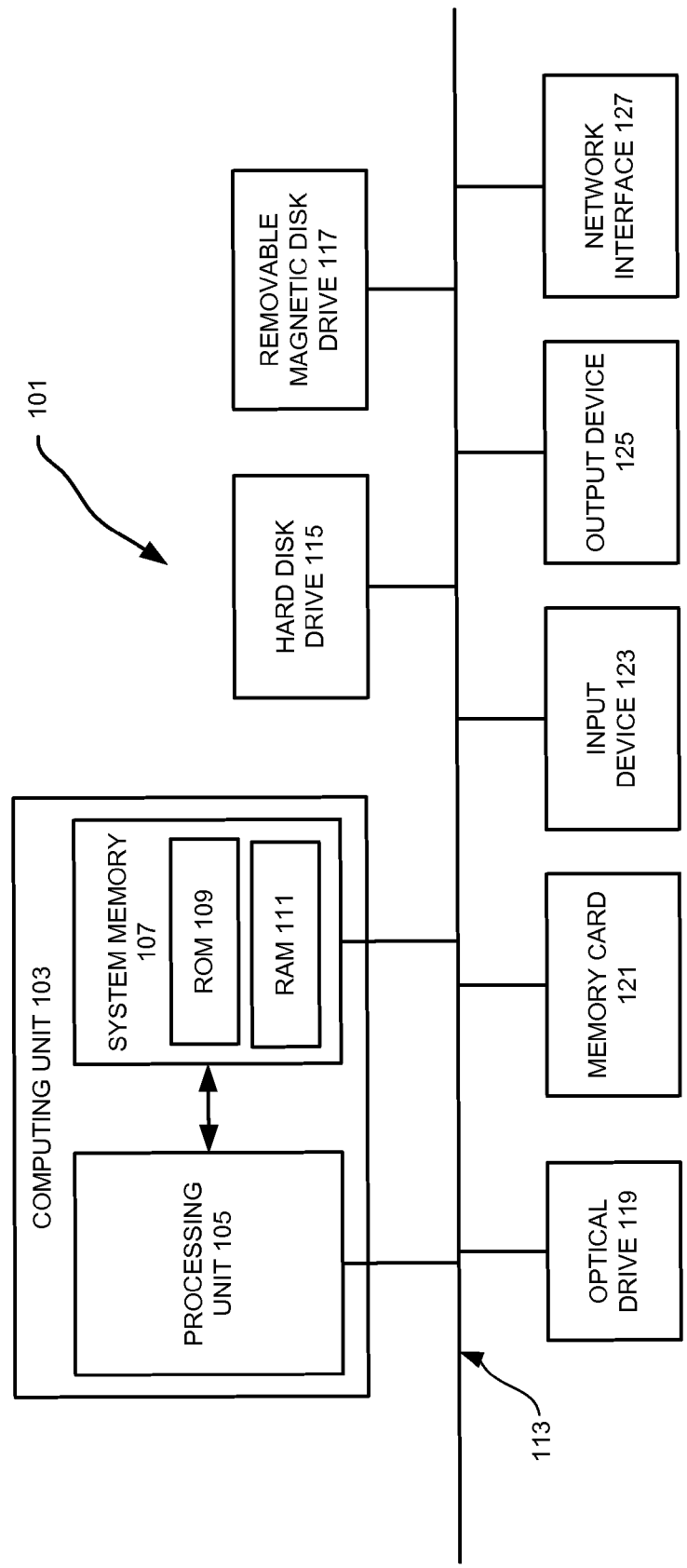
FIG. 1 illustrates a programmable computer system with which various embodiments of the invention may be employed.

Various embodiments of the invention may be implemented through the execution of software instructions by a computing system, such as a programmable computer or combination of multiple programmable computers. Further, various embodiments of the invention may be implemented by a computer system executing various software instructions for performing the functionality of the invention, or by software instructions for performing the functionality of the invention stored on a computer-readable medium. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, include only a subset of the components illustrated in FIG. 1, or include an alternate combination of components, including components that are not shown in FIG. 1. For example, various embodiments of the invention may be implemented by a computing system using a multi-processor computer, a plurality of single and/or multiprocessor computers arranged into a network, or some combination of both.

Dynamic Channel Allocation

Figure 2:
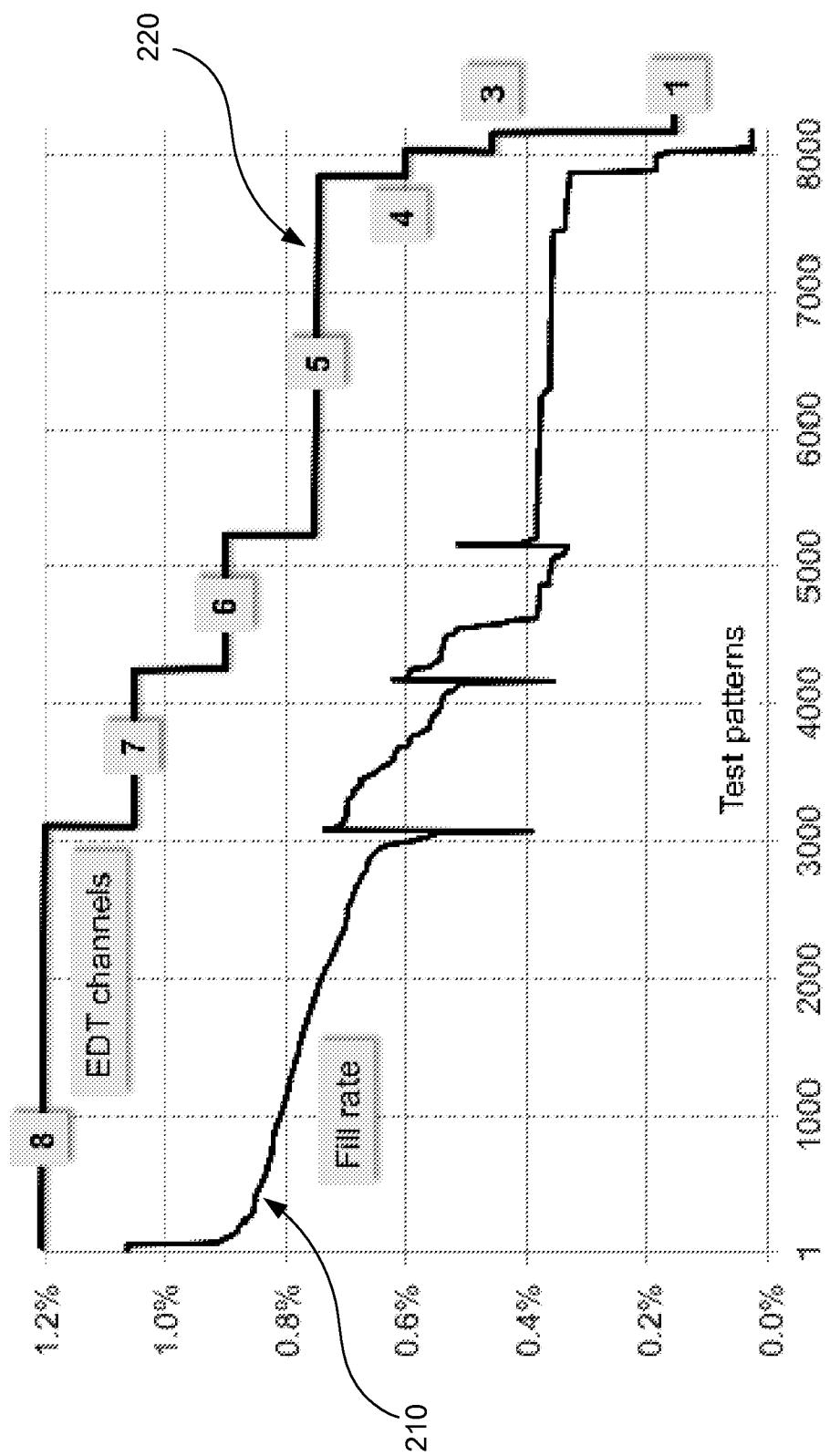
FIG. 2 illustrates a test pattern fill rate profile and an EDT channel profile for an industrial design.

A large body of experimental evidence shows that test patterns, even those generated using sophisticated dynamic compaction targeting multiple faults with multiple clock compression, have fill rates (percentages of specified bits) in the range from 1% to 5% only at the beginning of the process. After the first couple of test patterns, the fill rate may drop well below 1%. FIG. 2 illustrates an example of a test pattern fill rate profile 210 for an industrial design. As seen in the figure, the fill rate varies between 1.1% and 0.02% for more than 8,000 test patterns. Also illustrated in the figure are the minimum numbers of EDT (embedded deterministic test) channels needed for delivering compressed test patterns—the EDT channel profile 220. For a SOC that employs EDT technology, the EDT channels are core input channels. The EDT channel profile 220 shows operating a decompressor with a fixed number of circuit input channels may lead to unproductive channel utilization. To optimize channel utilization, circuit input channels for testing may be assigned to decompressors for different cores in different time slots based on their needs. Here, a SOC is assumed to have a decompressor for each core and the cores are isolated by proper test wrappers. This flexible assignment can enable more cores being tested in parallel. More cores being tested in parallel shortens test application time and reduces the number of circuit input channels required for delivering test data to multiple cores.

Like the low fill rates associated with most of test patterns, typically percentages of observation points in test responses are low and only very few test patterns need to use all of the core output channels to observe detected faults. Therefore, circuit output channels for testing may also be assigned to different cores based on their needs in different time slots. The flexible assignment of circuit input channels and circuit output channels may be referred to as dynamic channel allocation.

It should be noted the EDT technology is used here as an example to illustrate the idea of dynamic channel allocation. The EDT technology will also be used below. A person having ordinary skill in the art would nonetheless appreciated that various embodiments of the invention may be applied to circuits employing different test compression technologies.

Test Access Mechanism (TAM)

Figure 3:
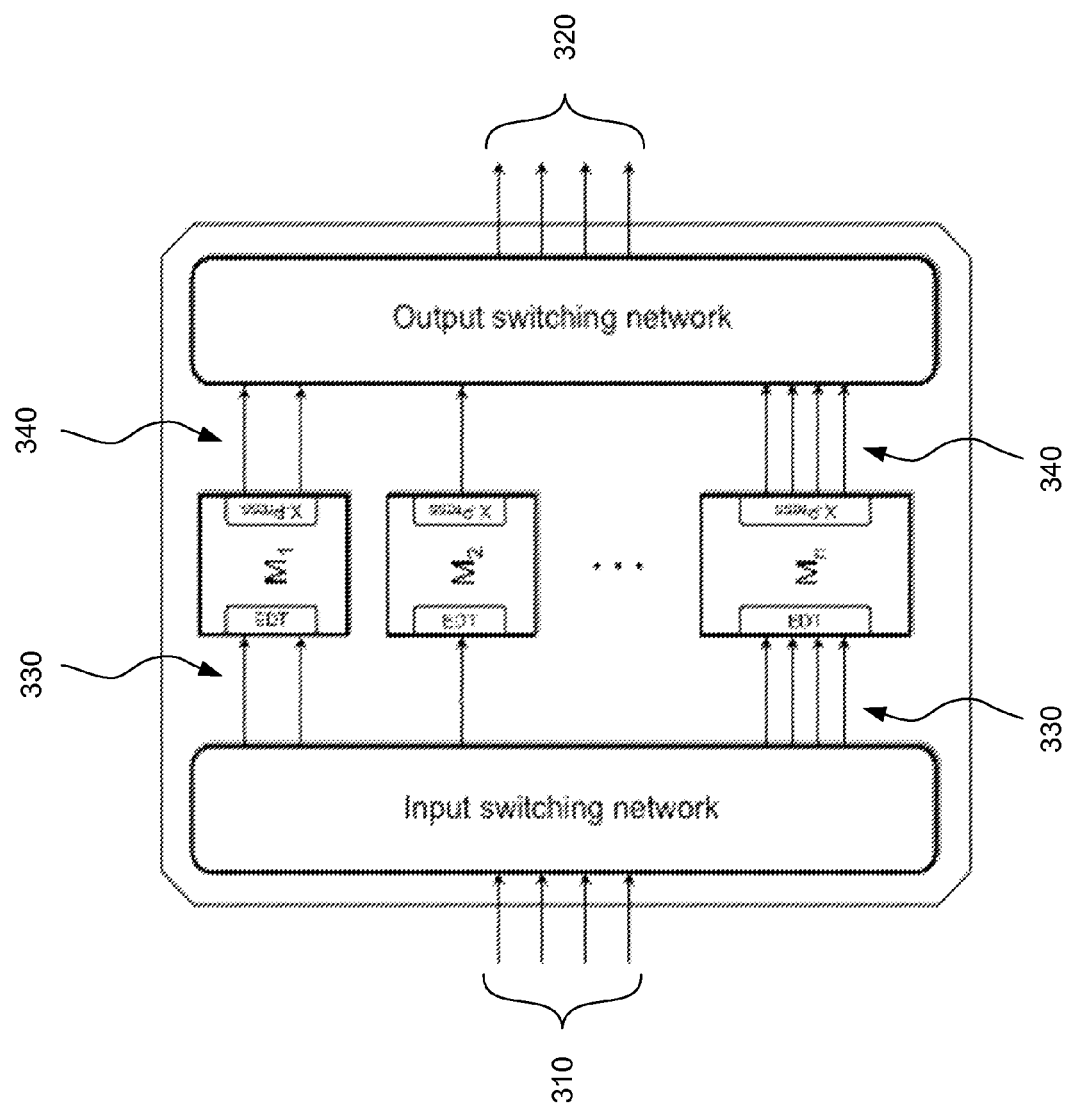
FIG. 3 illustrates an example of a SOC test environment in accordance with various implementations of the invention.

FIG. 3 shows an example of a SOC test environment in accordance with various implementations of the invention. The SOC test environment employs a TAM that comprises two switching networks: an input switching network and an output switching network. The input switching network connects circuit input channels 310 with core input channels 330 while the output switching network connects circuit output channels 320 with core output channels 340. When an ATE is used, the circuit input channels 310 and the circuit output channels 320 are often referred to as ATE input channels and ATE output channels, respectively.

Figure 4:
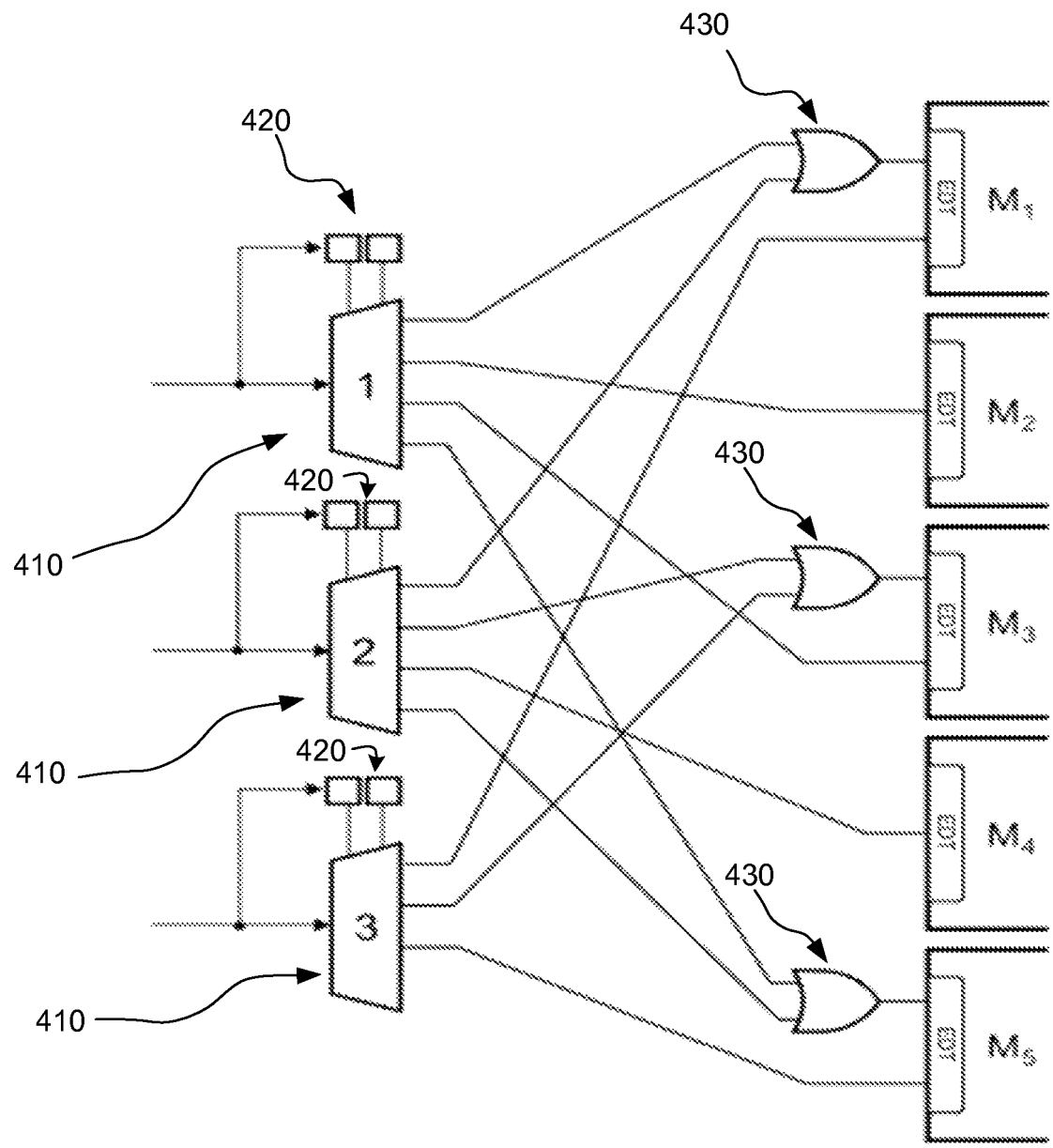
FIG. 4 illustrates an example of an input switching network in accordance with various implementations of the invention.

The input switching network can reroute compressed test data to different cores. An example of an input switching network (also referred to as input interconnection network) is illustrated in FIG. 4. The input switching network in this example comprises n demultiplexers 410, where n is the number of circuit input channels. The number n cannot be smaller than the capacity of the largest single core in terms of its core input channels. The number of core input channels for each core may be determined based on various factors such as the size of the circuit and the number scan chains.

Each demultiplexer 410 in FIG. 4 serves to connect a given circuit input channel to several cores. The associated address register 420 stores control data specifying which core and which one of its core input channels is to be selected for a given group of test patterns. The control data may be uploaded through the same circuit input channel as a part of a compressed test vector. Because several demultiplexers (circuit input channels) may feed the same core input channel, OR gates 430 may be used to facilitate this type of connectivity.

With some implementations of the invention, low-order core input channels of each core are used most extensively. Thus, the OR gates 430 are usually used for these core input channels. The number of circuit input channels that drive these core input channels may be determined by the following equation:

$$G_k = \lceil \log_2(E-k+C) \rceil, \quad (1)$$

where $G_k$ is the fan-in of $k_{th}$ OR gate, E is the number of core input channels, and C is a user-defined constant (in all experiments reported below C≤5). According to this equation, the number of OR gate inputs is gradually decreasing (the pace is logarithmic) with the increasing core input channel label. It is worth noting that the number $G_k$ cannot exceed the value of n (an OR gate cannot have more inputs than the number of circuit input channels). If this is a case, $G_k$ becomes equal to n.

Given the demultiplexers 410 and the OR gates 430, one may arrange connections between the circuit input channels and the core input channels for each core. One algorithm for connections employs two pointers moving synchronously. The first one scans the core input channels while the other one visits cyclically (modulo n) the circuit input channels. At every step, a link (i.e., a wire) is established between a circuit input channel and a core input channel according to the current locations of both pointers. Consider, for instance, a network shown in FIG. 3 having n=3 circuit input channels and five cores. First, OR gates are placed in the front of certain cores in accordance with equation (1). Subsequently, three core input channels of core $M_1$ are connected to the demultiplexers 1, 2, and 3. Next, core $M_2$ is connected to the demultiplexer 1, while three core input channels of core $M_3$ are connected to the demultiplexers 2, 3, and 1, respectively. This process continues as long as there are still unconnected core input channels (in this example, for cores $M_4$ and $M_5$). Some adjustments within a single core are also possible to simplify the resultant layout of the network and to avoid potentially long connections between a given core and channels flanking the input interconnection network, as done for core $M_5$ whose connections were simply permuted. Note that by virtue of this algorithm, the actual size of the demultiplexers and the size of their control registers may be determined.

Figure 5:
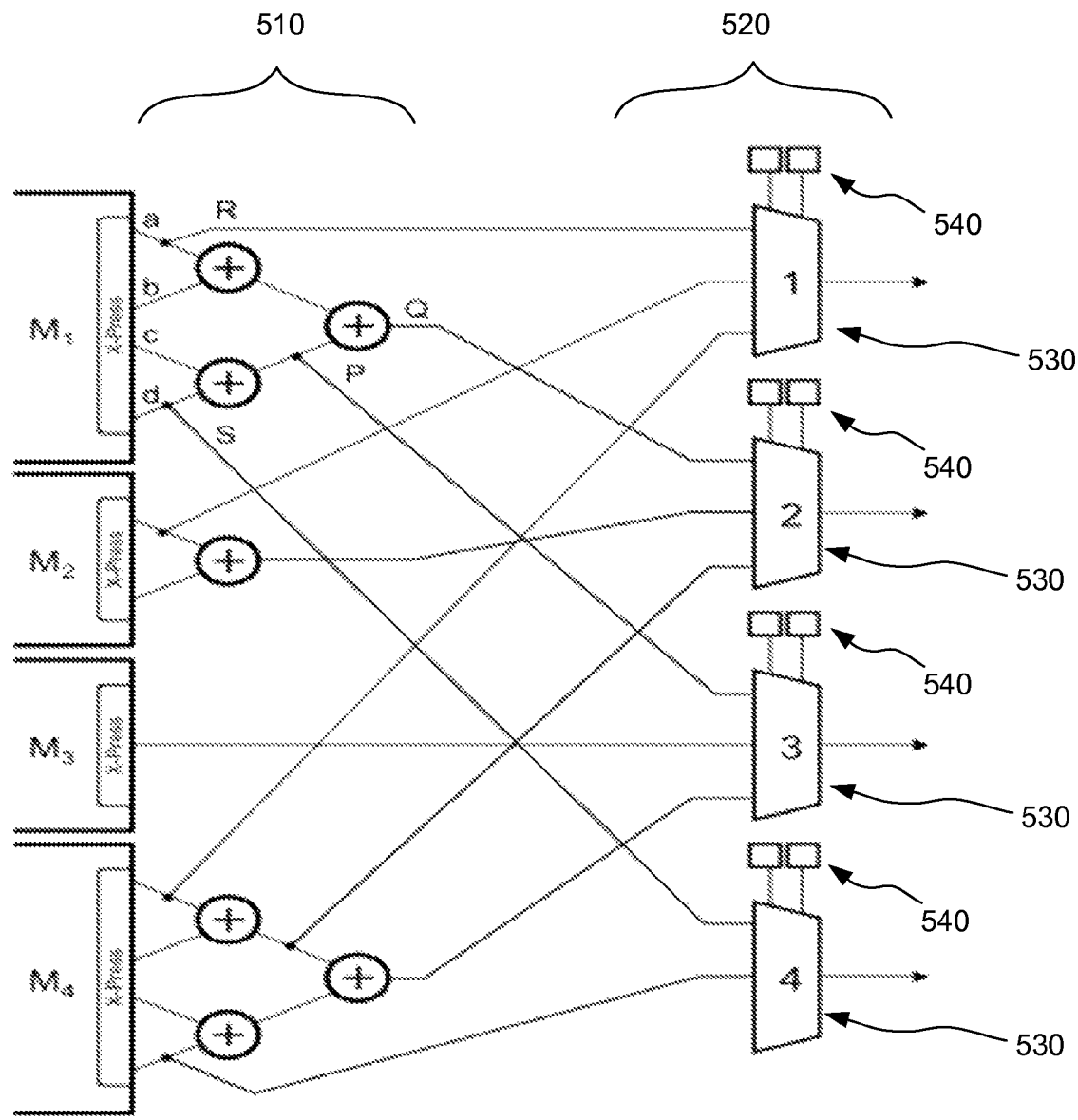
FIG. 5 illustrates an example of a two-stage output switching network in accordance with various implementations of the invention.

The output switching network (or output interconnection network) interfaces the core output channels with the circuit output channels. With some implementations of the invention, the output switching network includes two stages as illustrated in FIG. 5: an output data selector 510 and an egress unit 520. The output data selector 510 allows merging test responses in multiple core output channels for a core. Conventional XOR trees, working with the X-masking scheme, such as the X-masking scheme discussed in the article "X-Press: two-stage X-tolerant compactor with programmable selector", by Rajski et al., *IEEE Trans. CAD*, vol. 27, pp. 147-159, January 2008, which article is incorporated herein by reference, may serve as the output data selector 510. The merging by the output selector combines observation points into small numbers of channels provided there is no risk of error masking due to either aliasing or unknown states. As mentioned earlier, typically only very few test patterns require all core output channels to observe detected faults. The diminishing number of detected faults allows the remaining test patterns to work with subsets of core output channels.

As can be seen in FIG. 5, simple XOR trees merge test responses in such a way that the entire core may be observed through a single channel, if permitted. On the other hand, additional observation points allow one to collect less compressed data and enables, for example, more accurate diagnosis of a group of scan chains of a given core. Despite an extra XOR tree, the number of observation points may match exactly the number of core output channels. In FIG. 5, for example, core M1, which has four core output channels may use observation lines indicated as Q, P, R, and S. To retrieve data produced by core output channel b, one needs to collect data from Q (a+b+c+d), P (c+d), and R (a), and then subtract streams P and R from Q. Furthermore, any unknown state produced on one of the outputs a, c, or d will not harm data arriving from b as it always occurs twice in data streams Q, P, and R, and thus will be filtered out. This phenomenon is similar to the one deployed by the X-filtering schemes described in the articles "Increasing output compaction in presence of unknowns using an X-canceling MISR with deterministic observation," by Garg et al., *Proc. VTS*, pp. 35-42, 2008 and "X-filter: filtering unknowns from compacted test responses," by Sharma et al., *Proc. ITC*, pp. 1090-1098, 2005, both of which are incorporated herein by reference. Because some observation points are used more frequently than others (such as output Q in FIG. 5), such lines may feature a fan-out, so they end up connected to several ATE channels to reduce the likelihood of not being observed in parallel with other cores.

The egress unit 520 in the output switching network may be formed by multiplexers 530 that connect several cores with a circuit output channel. Similar to the input interconnection network, address registers 540 may be employed to specify which cores are to be observed for a given group of test patterns. The output channel mapping may be carried out in a manner similar to that of the input interconnection network: while scanning the observation points of successive cores, links are established between them and the cyclically visited multiplexers (modulo the number of circuit output channels).

Test Scheduling Tools and Methods

Figure 6:
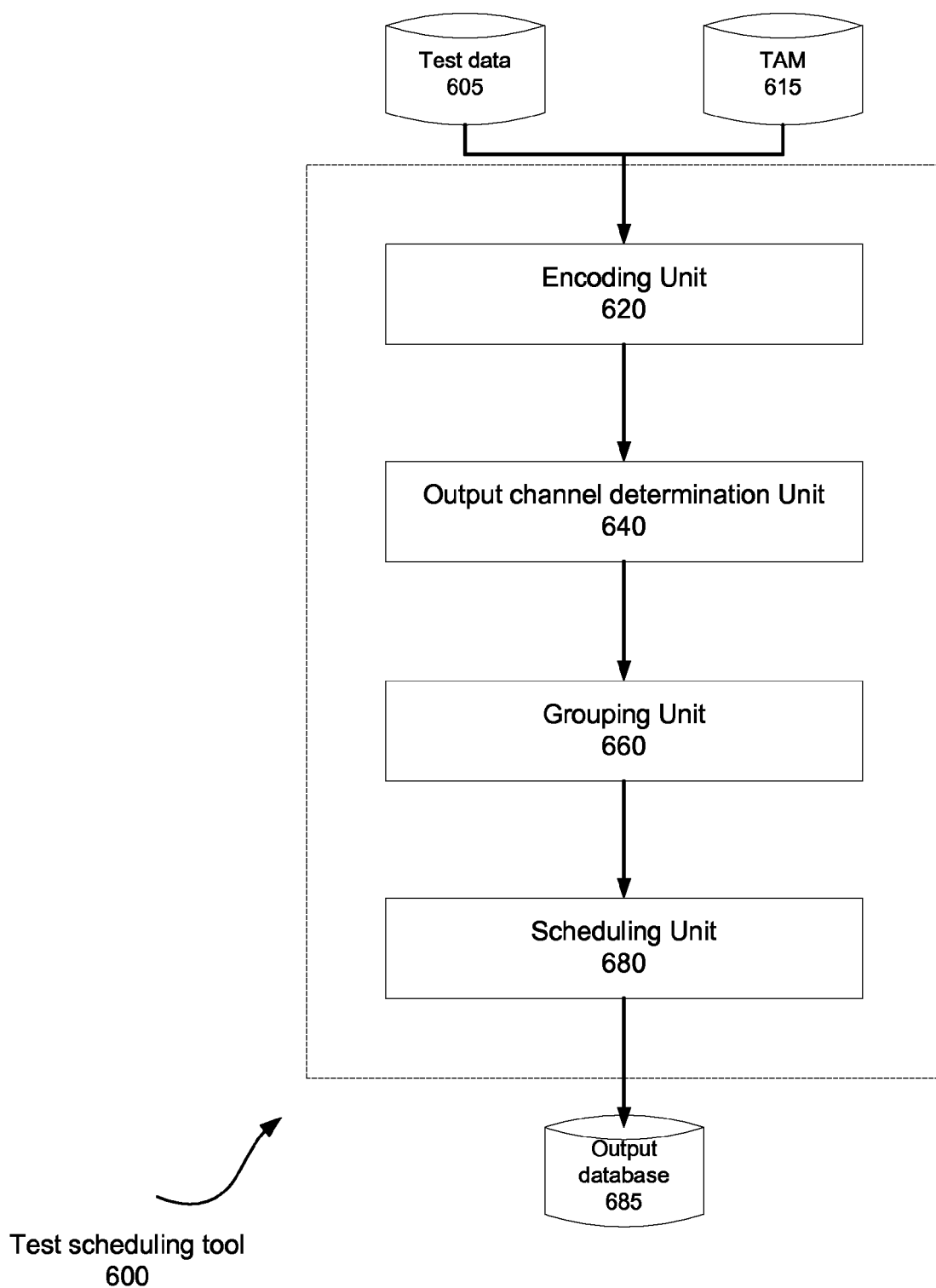
FIG. 6 illustrates an example of a test scheduling tool according to various embodiments of the invention.

FIG. 6 illustrates an example of a test scheduling tool 600 according to various embodiments of the invention. As seen in the figure, the test scheduling tool 600 includes four main units: an encoding unit 620, an output channel determination unit 640, a grouping unit 660 and a scheduling unit 680. As will be discussed in more detail below, some implementations of the test scheduling tool 600 may cooperate with (or incorporate) one or more of a test data database 605, a TAM database 615, and an output database 685. While the test data database 605, the TAM database 615 and the output database 685 are shown as separate units in FIG. 6, a single data storage medium may be used to implement some or all of these databases.

According to some embodiments of the invention, one or more of the encoding unit 620, the output channel determination unit 640, the grouping unit 660 and the scheduling unit 680 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of one or more of the encoding unit 620, the output channel determination unit 640, the grouping unit 660 and the scheduling unit 680. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 7:
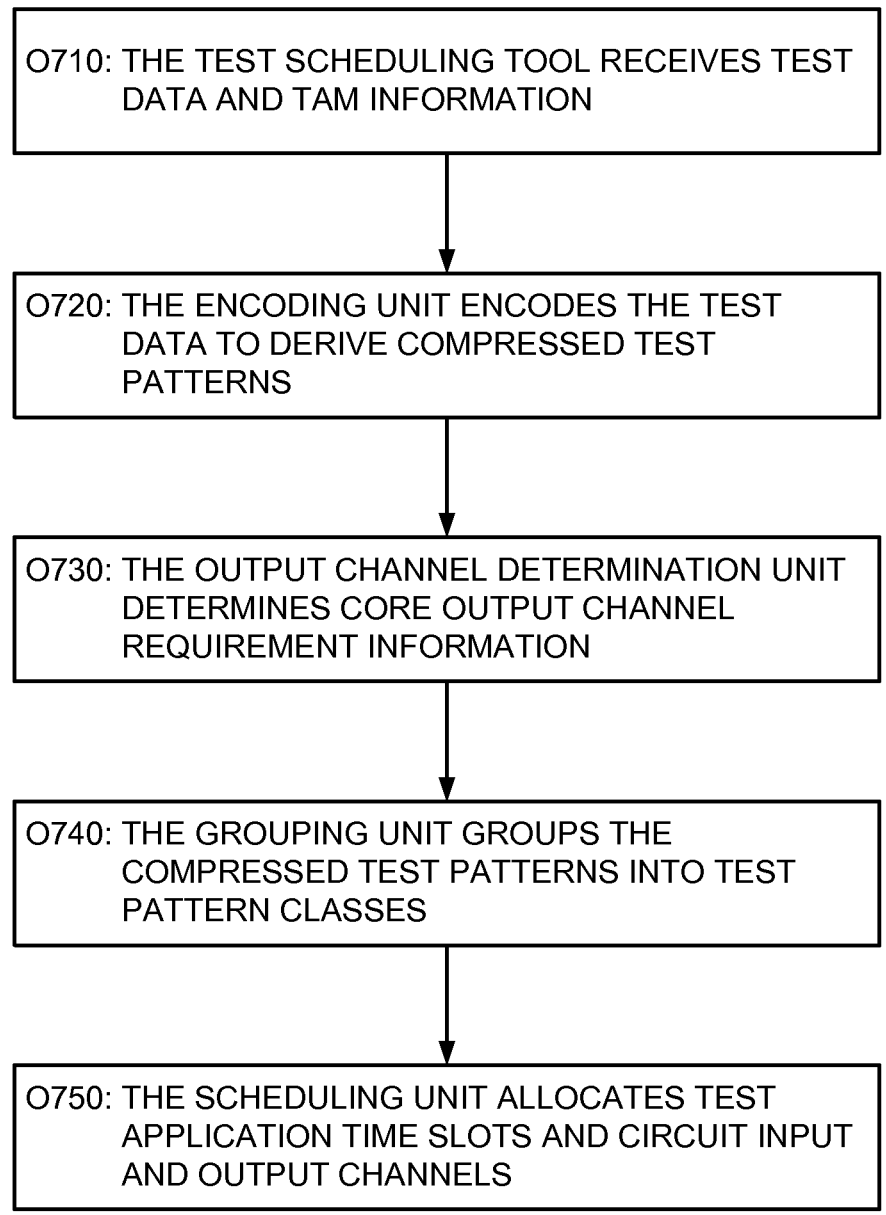
FIG. 7 illustrates a process for test scheduling in accordance with various embodiments of the invention.

For ease of understanding, test scheduling methods that may be employed according to various embodiments of the invention will be described with reference to the test scheduling tool 600 illustrated in FIG. 6 and the method of test scheduling shown in the flowchart illustrated in FIG. 7. It should be appreciated, however, that alternate implementations of a test scheduling tool may be used to perform the test scheduling methods according to various embodiments of the invention. In addition, it should be appreciated that implementations of the test scheduling tool 600 may be employed with other methods for test scheduling according to different embodiments of the invention.

Initially, in operation 710, the test scheduling tool 600 receives test data for testing a plurality of cores in a circuit from the test data database 605 and information of TAM for the circuit from the TAM database 615. The test data may comprise test cubes derived by ATPG. The information of TAM may comprise information of an input switching network that connects circuit input channels to core input channels for each of the plurality of cores, and information of an output switching network that connects circuit output channels to core output channels for each of the plurality of cores.

Next, in operation 720, the encoding unit 620 encodes the received test data to derive compressed test patterns that require small numbers of the core input channels. In a conventional EDT encoding procedure, test data are treated as variables forming expressions assigned to scan cells. A compressed test pattern may then be obtained by solving a set of linear equations in GF(2), as discussed in the '569 and '028741 patent applications. During the solution process, Gaussian elimination may be employed to determine a reduced row-echelon form of equations by picking leading variables in a sequence of their injections. As a result, data injected through all input channels may be needed to find a solution. However, one may interchange rows and columns of the matrix for the set of linear equations, so as to put a desirable variable in a position from which the leading variable is to be selected. This enables determining the smallest number of input channels needed to compress a given test pattern. For example, choosing leading variables can give priority to their source channels rather than the time of occurrence. Consequently, even data injected through a single channel may suffice to encode a given test pattern, as shown in the '569 and '028741 patent applications. This approach was used, for example, to construct the EDT channel profile 220 presented in FIG. 2. In order to avoid recomputing seed variables, the same technique also assumes that EDT input channels (core input channels when a SoC employs the EDT technology) are deployed in an ascending order, i.e., a single input channel request always results in assigning EDT input channel no 1, a two-input-channel request ends up with EDT input channels 1 and 2 (but not 1 and 3, or 2 and 3), a three-input-channel request will involve EDT input channel 1, 2, and 3.

With some implementations of the invention, the encoding unit 620 may derive compressed test patterns that require the minimum numbers of the core input channels. With some other implementations of the invention, the encoding unit 620 may derive compressed test patterns that require greater than the minimum numbers of the core input channels. With still some other implementations of the invention, the encoding unit 620 may derive compressed test patterns of which some require the minimum numbers of the core input channels and others require greater than the minimum numbers of the core input channels. Regardless of the methods, each of the compressed test patterns are associated with one or more cores in the plurality of cores to be tested and with core input channel requirement information. The core input requirement information may include the number of core input channels required.

Next, in operation 730, the output channel determination unit 640 determines core output channel requirement information for each of the compressed test patterns. With some implementations of the invention, the output channel determination unit 640 may determine a minimal subset of the core output channels required for each of the compressed test patterns to detect targeted faults despite the presence of X states. As mentioned early, typically very few test patterns require all core output channels to observe detected faults. This, along with the fact that the number of observation points for a test pattern may be varied, may be used to improve bandwidth management of the circuit output channels. Selection of observation points for a test pattern may be based on the analysis of faults detected on successive core output channels of a particular core, their mutual masking, and impact of unknown states. Given a group of test patterns (typically 32 or 64 vectors are analyzed in parallel as a result of internal data representation adopted by most of ATPG tools), selection of observation sites may be carried out according to the following operations.

First, a list of faults detected by the group of test patterns is determined by the output channel determination unit 640. Also, for each test pattern p from the group and for each designated observation point x, individual lists $L_{x,p}$ of faults visible on x when applying vector p are created (in particular, this is done by taking into account effects caused by both aliasing and X-masking). It should be noted that the final output as well as internals of the XOR tree for the output switching network may act as observation points.

Second, until the main fault list is empty, the following four operations are repeated by output channel determination unit 640: 1) selecting a fault, e.g., fault f, from the main list and finding the highest ordered observation points having lists that include the selected fault (note that the primary output of the XOR tree has the highest order); 2) among the observation points selected above, choosing the one with the longest fault list $L_{x,p}$ and marking point x as the observation site when applying test pattern p; 3) deleting all faults occurring on list $L_{x,p}$ from the main fault list; and 4) if there are observation points z (starting from the highest order ones) that were assigned earlier to test pattern p, then verifying whether lists $L_{z,p}$ are subsets of $L_{x,p}$; and if so, unmarking such observation points as redundant items.

Next, in operation 740, the grouping unit 660 groups the compressed test patterns into test pattern classes based on cores associated with each of the compressed test patterns, the core input channel requirement information and the core output channel requirement information. In some embodiments of the invention, every compressed test pattern may be characterized by its descriptor:

$$D(t)=(m,c,\{o_1,o_2,\ldots,o_n\}) \qquad (2)$$

where m is the module that is to be exercised when applying test t, the channel capacity c is the number of core input channels needed for this purpose, and $\{o_1, o_2, \ldots, o_n\}$ is the list of observation points (or a list core output channels) determined for core m and test t. All test patterns having the same descriptor form a test pattern class. With some implementations of the invention, two descriptors are identical only when all of their components are exactly the same. As a group of test patterns, a test pattern class x also may be represented by its pattern count P(x). This function roughly reflects the test application time of a given class. Two classes with the same pattern counts may, however, differ in terms of actual test times due to the variety of cores that feature their own scan architectures, where varying scan lengths may impact test application if a tester permits.

In some other embodiments of the invention, a test pattern class may be further characterized by combining individual properties of its member test patterns, such as power dissipation profiles. To simplify test scheduling, the peak power q dissipated over all test vectors may be used. Accordingly, the descriptor for a test pattern class becomes then a 4-tuple as follows:

$$D(t)=(m,c,\{o_1,o_2,\ldots,o_n\},q). \qquad (3)$$

The number of transitions in the combinational part of a core may be a linear function of transitions occurring in scan chains when shifting in test patterns and shifting out test responses. Therefore, a weighted transition metric may be applied to estimate the switching activity due to scan patterns, and then the corresponding power dissipated in the core may be computed by means of a linear extrapolation. This method is described in "Scheduling tests for VLSI systems under power constraints," *IEEE Trans. VLSI*, vol. 5, pp. 175-184, June 1997, which is incorporated herein by reference. The maximum value of power consumption q over all vectors belonging to a given class may then be used to guide test scheduling so as not to exceed the maximal allowed power consumption at any time.

It should be noted that every test pattern class can also be split into multiple segments such that test patterns from the same class are applied in disjoint time intervals as if they were independent classes. The ability to preempt a class may improve the circuit channel utilization, shorten the total test application time, and reduce the volume of control data.

Finally, in operation 750, the scheduling unit 680 allocates, based on the information of TAM, test application time slots and the circuit input channels for delivering the test pattern classes to the plurality of cores and the circuit output channels for collecting test response data for the test pattern classes. Test pattern classes that are complementary may be merged to form clusters. These clusters represent cores that can be tested in parallel given constraints imposed by circuit input and output channels, structure of interconnection networks, and in some embodiments of the invention, allowed power consumption. Test pattern classes are complementary if they comprise disjoint subsets of cores. The scheduling unit 680 may maintain a sorted list of test pattern classes that begins with a class having the largest (in magnitude) product of a pattern count and a core input channel capacity. The largest assignments may be scheduled in early time slots.

With various implementations of the invention, the scheduling unit 680 may assign the first class in the sorted list of test pattern classes to the current result b of merging to form a base. Then, the scheduling unit 680 iterates over all the remaining classes and expands the base one class at a time, always taking the first class from the list that satisfies certain constraints. The primary constraint states that the input channel capacity for the class altogether with an input channel capacity of the current base cannot exceed the available circuit input channels. Similarly, the observation points for the class altogether with the observation points of the base members must fit into the circuit output channels. In some embodiments of the invention, the scheduling unit 680 may also consider other constraints such as power dissipation. These additional constraints may further restrict the merging process.

Given a base and a candidate setup class that satisfies the constraints, the scheduling unit 680 may determine whether all the cores involved can be successfully connected with the circuit input/output channels. This connectivity problem may be represented by a bipartite graph having vertices that are divided into two disjoint sets C and E representing the circuit input channels and core input channels, respectively, both relevant to the current base and test pattern classes. Every edge in the graph connects a vertex c in C with a vertex e in E provided there is a link (wire) between the circuit input channel c and the core input channel e of a core. The actual circuit channel allocation is now equivalent to a matching M in the bipartite graph, i.e., to an edge set such that no two edges of M share their endpoints. Every matching edge uniquely indicates a desired connection. Clearly, the objective is to arrive (if possible) with a feasible bipartite matching, that is, a solution where every vertex is incident to exactly on edge of the matching.

Figure 8:
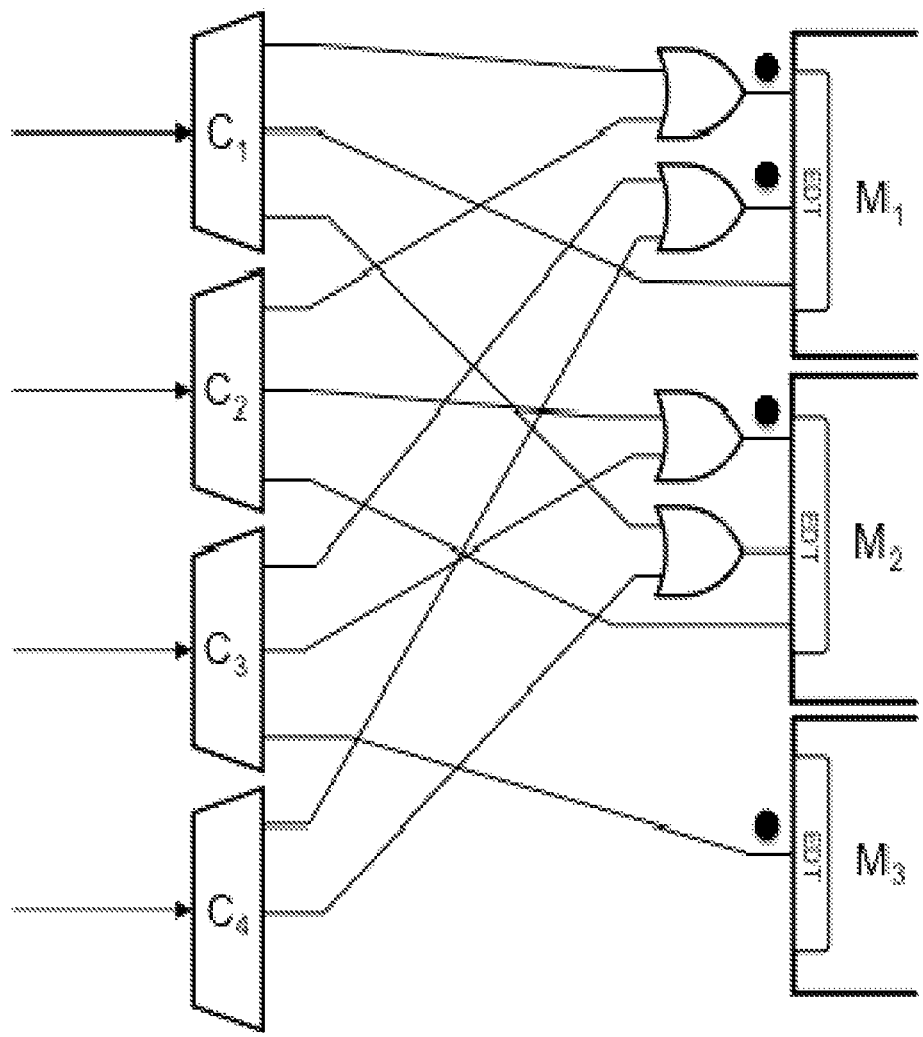
FIG. 8 illustrates an example of channel allocation for an input exchanging network.
Figure 9:
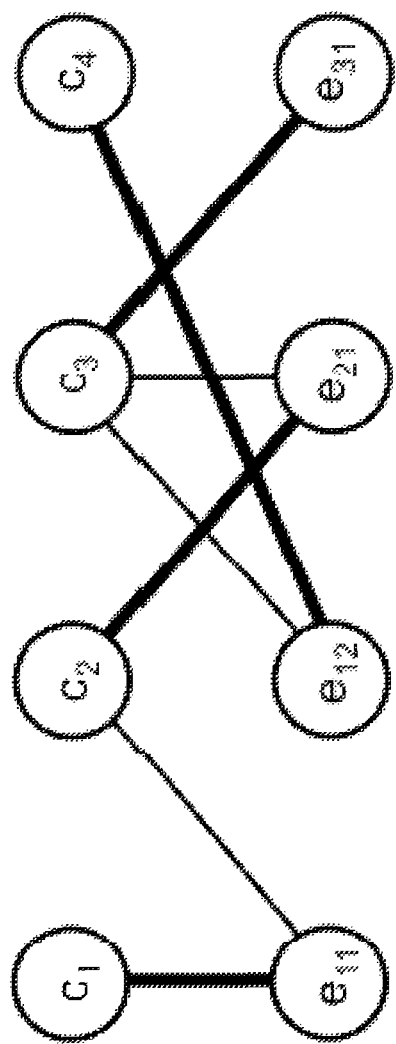
FIG. 9 illustrates a bipartite graph that may be used for channel allocation illustrated in FIG. 8.

FIG. 8 illustrates an example of an input exchanging network. The input exchanging network connects four circuit input channels with three different cores ($M_1$, $M_2$, and $M_3$). Two of the cores ($M_1$ and $M_2$) feature three EDT input channels (some with OR gates), whereas the last one ($M_3$) has a single EDT input channel. A test pattern class comprises test patterns for core $M_1$ requiring two EDT input channels and test patterns for cores $M_2$ and $M_3$, requiring a single EDT input channels for each core (black dots in FIG. 8). The scheduling unit 680 checks whether there is a possible allocation of the four circuit input channels to this test pattern class. An example of a bipartite graph according to various implementations of the invention is presented in FIG. 9. As can be seen, the set of matching edges denoted by bold lines represents the desired connections.

Making the above assignments blindly may first choose a wrong edge $c_3$–$e_{12}$. The Hoperoft-Karp algorithm, described in the article "An $n^{5/2}$ algorithm for maximum matchings in bipartite graphs," *SIAM Journal on Computing*, vol. 2, No. 4, pp. 225-231, 1973, which is incorporated herein by reference, is one method of organizing this procedure to obtain a maximal bipartite matching representing a channel allocation. The algorithm repeatedly increases the size of an initial partial matching by finding a maximal set of shortest augmenting paths. An augmenting path starts at a free vertex, i.e., a non-end-point of an edge in some partial matching M, ends at a free vertex, and alternates between unmatched and matched edges within the path. If M is a matching of size n, and A is an augmenting path relative to M, then the set M⊕A forms a matching with size n+1. Thus, by finding augmenting paths, the algorithm increases the size of the matching. If the resultant matching is the perfect one, then the solution (the actual channel allocation) is found. As will be appreciated by those of ordinary skill in the art, the same procedure is repeated for the output interconnection network and observation points of relevant cores.

When merging classes b and x, there may be three possible scenarios driven by their pattern counts. If $P(b)=P(x)$, then the class x is simply removed from the list as it joins the base. If $P(b)<P(x)$, then the setup class x is added to the base class but with the pattern count reduced to that of the base class. A copy of class x is also moved back to the list with a new pattern count equal to $P(x)-P(b)$. Finally, if $P(b)>P(x)$, then class x is removed from the list, the pattern count of the base is adjusted to a new (smaller) value $P(x)$, and the former base class is returned to the list with the pattern count equal to $P(b)-P(x)$.

The process of forming the base may terminate when either there are no more test pattern classes complementary with the base, or one of the constraints cannot be satisfied. The scheduling unit 680 may then remove the first element from the list and attempt to form another base cluster until the list of test pattern classes becomes empty, in which case the scheduling unit 680 returns a list of base classes. This list may be used to determine the actual schedule, i.e., an order according to which cores will be tested, as well as actual channel allocations. It can be further reordered to group tests for the same core in contiguous time intervals (slots).

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:
1. A method of test scheduling, comprising:
receiving test data for testing a plurality of cores in a circuit and information of TAM (test access mechanism) for the circuit, the information of TAM comprising information of an input switching network that connects circuit input channels to core input channels for each of the plurality of cores, and information of an output switching network that connects circuit output channels to core output channels for each of the plurality of cores;
encoding the test data to derive compressed test patterns that require small numbers of the core input channels, each of the compressed test patterns being associated with one or more cores in the plurality of cores and with core input channel requirement information;
determining core output channel requirement information for each of the compressed test patterns;
grouping the compressed test patterns into test pattern classes based on cores associated with each of the compressed test patterns, the core input channel requirement information and the core output channel requirement information; and
allocating, based on the information of TAM, test application time slots and the circuit input channels which deliver the test pattern classes to the plurality of cores and the circuit output channels which collect test response data for the test pattern classes.

2. The method recited in claim 1, wherein the test data comprises test cubes.

3. The method recited in claim 1, wherein the circuit input channels are ATE (automatic test equipment) input channels of the circuit and the circuit output channels are ATE output channels for the circuit.

4. The method recited in claim 1, wherein the core input channels are EDT (embedded deterministic test) input channels for the plurality of cores, and the core output channels are EDT output channels for the plurality of cores.

5. The method recited in claim 1, wherein the input switching network comprising demultiplexers and one or more OR gates.

6. The method recited in claim 1, wherein the output switching network comprises an output data selector that merges test responses leaving each of the plurality of cores and an egress unit.

7. The method recited in claim 1, wherein the output data selector comprises XOR trees.

8. The method recited in claim 1, wherein the egress unit comprises multiplexers.

9. The method recited in claim 1, wherein the core input channel requirement information comprises a number of core input channels required and the core output channel requirement information comprises specific information about which one or more core output channels are required.

10. The method recited in claim 1, wherein the small numbers of the core input channels are minimum numbers of the core input channels.

11. The method recited in claim 1, wherein the determining comprises selecting observation points for each of the compressed test patterns.

12. The method recited in claim 1, wherein the determining comprises determining a minimal subset of the core output channels required for each of the compressed test patterns.

13. The method recited in claim 1, wherein the grouping is further based on power consumption.

14. The method recited in claim 1, wherein compressed test patterns in each of the test pattern classes are associated with the same cores, need the same number of the core input channels, and use the same core output channels.

15. The method recited in claim 1, wherein the allocating is further based on power consumption.

16. The method recited in claim 1, wherein the allocating comprises merging complementary test pattern classes into clusters that can work with the TAM.

17. A non-transitory processor-readable medium storing processor-executable instructions for causing one or more processors to perform a method of test scheduling, comprising:

receiving test data for testing a plurality of cores in a circuit and information of TAM (test access mechanism) for the circuit, the information of TAM comprising information of an input switching network that connects circuit input channels to core input channels for each of the plurality of cores, and information of an output switching network that connects circuit output channels to core output channels for each of the plurality of cores;

encoding the test data to derive compressed test patterns that require small numbers of the core input channels, each of the compressed test patterns being associated with one or more cores in the plurality of cores and with core input channel requirement information;

determining core output channel requirement information for each of the compressed test patterns;

grouping the compressed test patterns into test pattern classes based on cores associated with each of the compressed test patterns, the core input channel requirement information and the core output channel requirement information; and allocating, based on the information of TAM, test application time slots and the circuit input channels for delivering the test pattern classes to the plurality of cores and the circuit output channels for collecting test response data for the test pattern classes.

18. A computer system comprising one or more processors, the one or more processors programmed to perform a method of test scheduling, comprising:

receiving test data for testing a plurality of cores in a circuit and information of TAM (test access mechanism) for the circuit, the information of TAM comprising information of an input switching network that connects circuit input channels to core input channels for each of the plurality of cores, and information of an output switching network that connects circuit output channels to core output channels for each of the plurality of cores;

encoding the test data to derive compressed test patterns that require small numbers of the core input channels, each of the compressed test patterns being associated with one or more cores in the plurality of cores and with core input channel requirement information;

determining core output channel requirement information for each of the compressed test patterns;

grouping the compressed test patterns into test pattern classes based on cores associated with each of the compressed test patterns, the core input channel requirement information and the core output channel requirement information; and allocating, based on the information of TAM, test application time slots and the circuit input channels for delivering the test pattern classes to the plurality of cores and the circuit output channels for collecting test response data for the test pattern classes.

* * * * *